United States Patent
Ng et al.

(10) Patent No.: US 7,514,724 B2
(45) Date of Patent: Apr. 7, 2009

(54) SOLID STATE LIGHT SOURCE HAVING A VARIABLE NUMBER OF DIES

(75) Inventors: Keat Chuan Ng, Sungai Dua (MY); Chiau Jin Lee, Jalan Permatang Damar Laut (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 75 days.

(21) Appl. No.: 11/690,554

(22) Filed: Mar. 23, 2007

(65) Prior Publication Data
US 2008/0273340 A1   Nov. 6, 2008

(51) Int. Cl.
*H01L 23/495* (2006.01)

(52) U.S. Cl. .......... 257/99; 257/100; 257/676; 257/E33.066; 257/E23.043

(58) Field of Classification Search ............ 257/99, 257/100, 676, E33.066, E23.043
See application file for complete search history.

(56) References Cited

U.S. PATENT DOCUMENTS

| 4,727,649 | A  | * | 3/1988 | Nishizawa | 29/840 |
| 6,552,368 | B2 | * | 4/2003 | Tamai et al. | 257/98 |
| 7,242,032 | B2 | * | 7/2007 | Oshio | 257/99 |
| 2008/0158886 | A1 | | 7/2008 | Pang et al. | |

* cited by examiner

*Primary Examiner*—Ngan Ngo
*Assistant Examiner*—Benjamin Tzu-Hung Liu

(57) ABSTRACT

A light source having a die carrier, a lead frame, and an insulating body is disclosed. The die carrier includes a die mounting section connected to a heat transfer section. The die mounting section includes a die mounting area having a lead pad opening contained within the die mounting area. The lead frame includes a lead pad. An electrically insulating material fills the voids between the die carrier and the lead frame to maintain the lead frame and die carrier such that a surface of the heat transfer section is exposed on a surface of the body, the lead pad is positioned in the lead pad opening, and the die carrier is electrically isolated from the lead frame. A plurality of dies are attached to the die mounting area and connected to the lead pad.

9 Claims, 5 Drawing Sheets

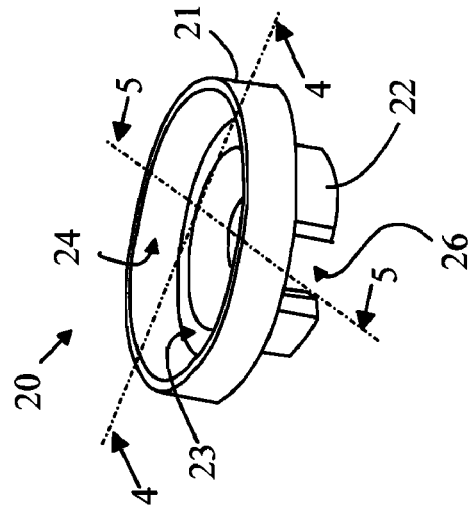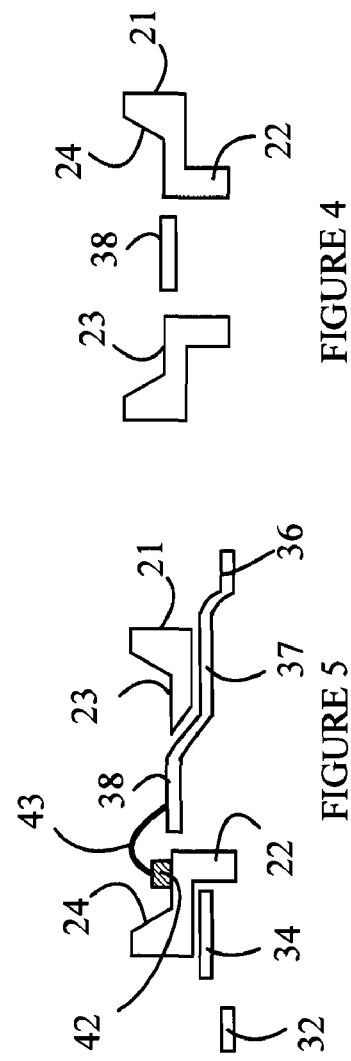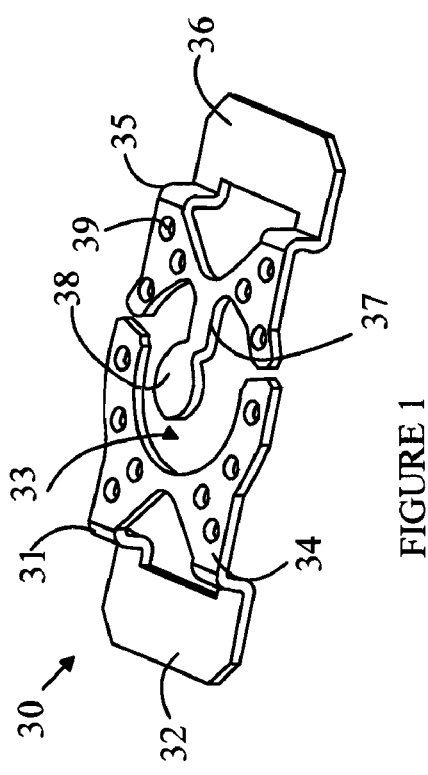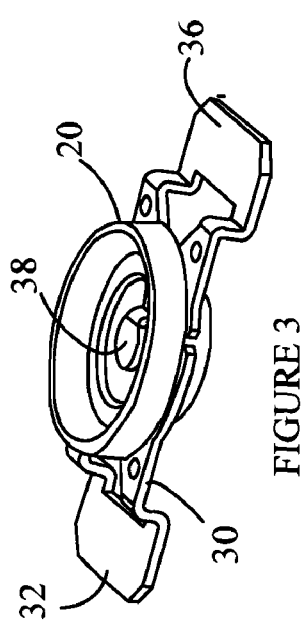

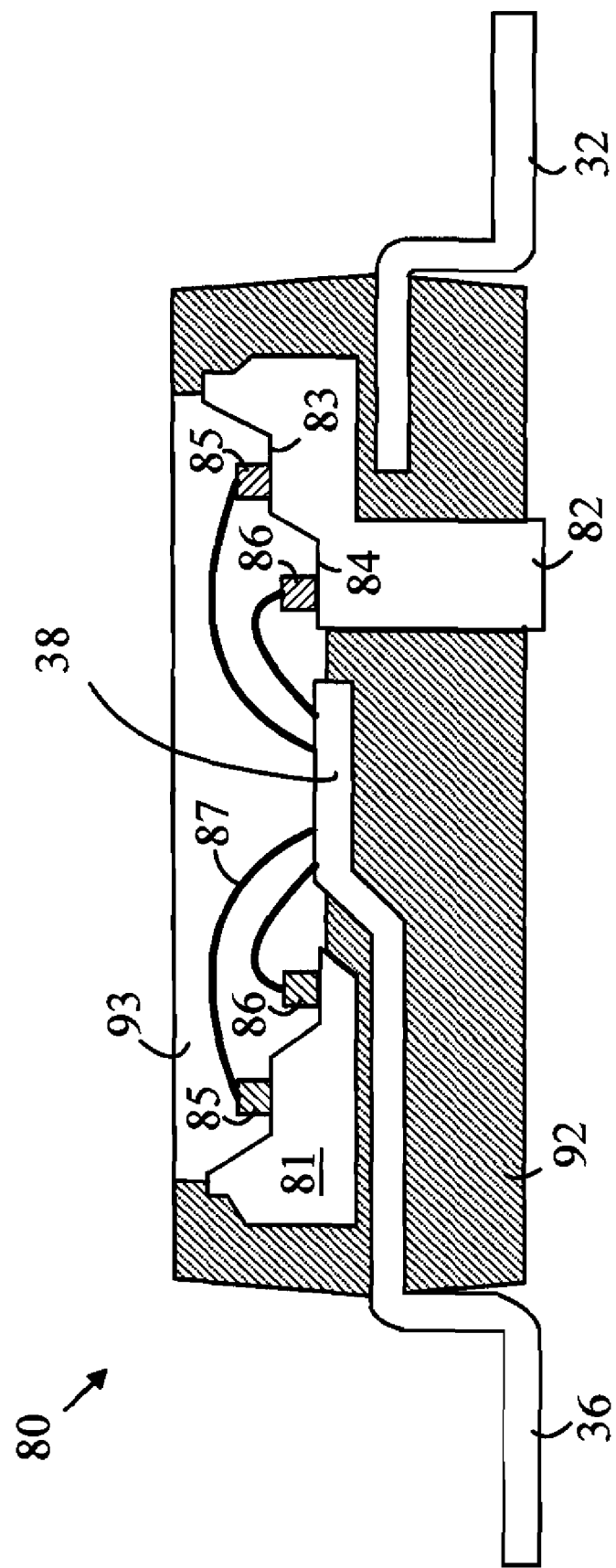

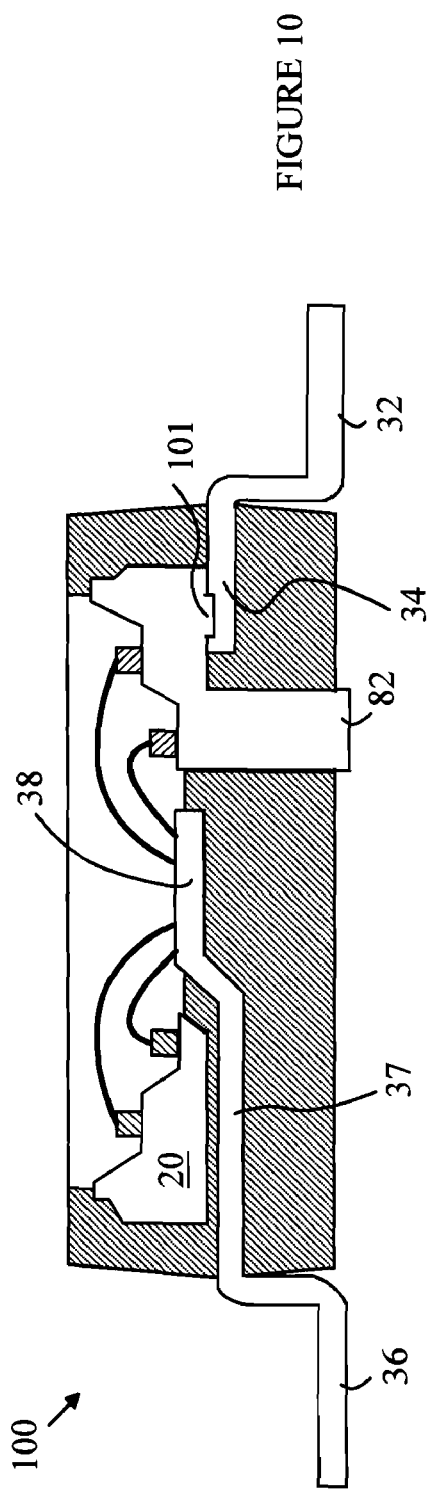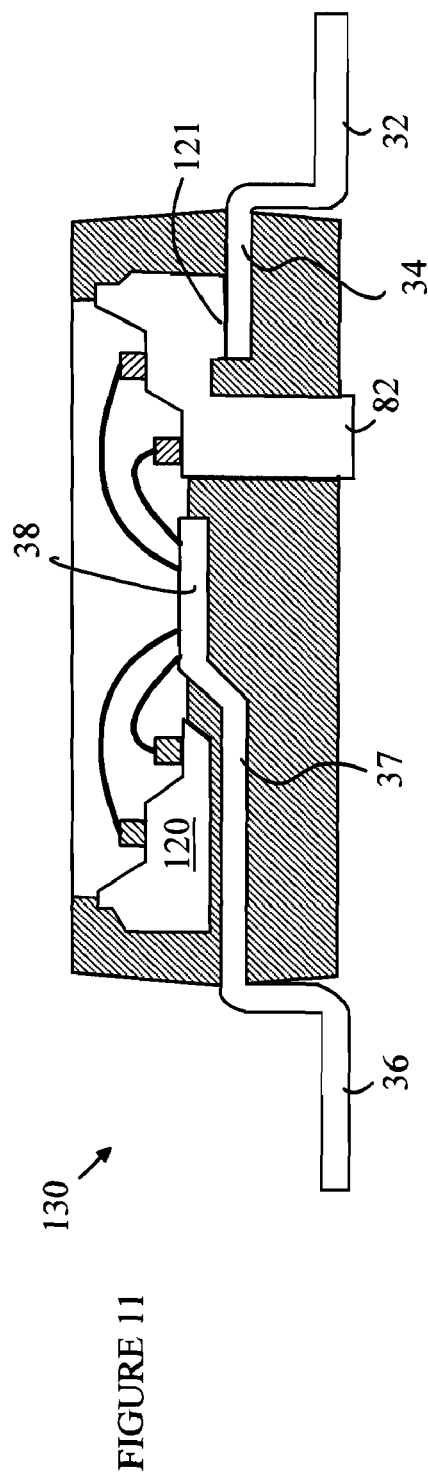

SOLID STATE LIGHT SOURCE HAVING A VARIABLE NUMBER OF DIES

BACKGROUND OF THE INVENTION

Light-emitting diodes (LEDs) are attractive replacement candidates for conventional light sources based on incandescent bulbs and fluorescent light tubes. LEDs have higher energy conversion efficiency than incandescent lights and substantially longer lifetimes than both incandescent and fluorescent light fixtures. In addition, LED-based light fixtures do not require the high voltages associated with fluorescent lights. Finally, white LEDs with light conversion efficiencies significantly greater than those of fluorescent light tubes have been demonstrated in the laboratory and are now becoming commercially available.

Unfortunately, LEDs having outputs equivalent to that of a large conventional light source are not commercially available; hence, high power LED sources require that a large number of individual LEDs be combined to provide the desired output. The LEDs can be individually packaged and mounted on a separate substrate such as a printed circuit board or the like. Alternatively, a package in which a number of dies are mounted together and then encapsulated can be utilized.

The first solution leads to a light source that is significantly larger and more expensive than the second solution. The individually packaged LEDs typically consist of a die in a reflective cup that is encapsulated in a clear layer of material that protects the die from environmental attack. The cup collects light that leaves the sides of the die and redirects that light to the forward direction. In addition, each package must provide some mechanism that moves the heat generated by the LED to the outer surface of the package that is in contact with the printed circuit board on which the package die is eventually mounted. Hence, the packaged LED is significantly larger than the die. In addition, the package represents a significant fraction of the final cost of the packaged die. In addition, the manufacturer of the final product in which the light source is incorporated is forced to assemble the multiple packaged parts and provide a design based on multiple dies instead of the single conventional light source that the LED source is replacing.

Hence, a solution having a single final packaged part is often preferred. Unfortunately, the multi-die packages currently available have a number of problems. Inexpensive packages based on encapsulated lead frames typically provide space for only a few dies at most. The dies are mounted on one or more leads within the package. The heat generated by the dies is moved through the lead on which the dies are mounted, and hence, the heat removal capacity is limited by the heat moving capacity of one of the leads. Since the cross-sectional area of a lead is relatively small, the heat removal capacity is also limited. Various schemes for reducing the thermal resistance of the mounting lead have been utilized or proposed; however, the package's heat removal capacity is limited by the number of dies that can be mounted within a single small lead frame package.

Arrangements in which a large number of dies are packaged together in an extended light source having a specific configuration are also known. For example, U.S. patent application Ser. No. 11/618,459 (now published as U.S. Patent Application Publication No. 2008015886A1) discloses a linear light source in which a large number of LED dies are mounted on a substrate within a large package to provide a high power light source. Unfortunately, the cost of such light sources is prohibitive for many applications. In addition, the shape of the light source is fixed. If, for example, a light source in which the dies are arranged in a ring configuration were required, the light source would need to be almost totally redesigned.

SUMMARY OF THE INVENTION

The present invention includes a light source having a die carrier, a lead frame, and an insulating body. The die carrier includes a die mounting section connected to a heat transfer section. The die mounting section includes a die mounting area having a lead pad opening contained within the die mounting area. The lead frame includes a lead pad. The body includes an electrically insulating material that fills voids between the die carrier and the lead frame to maintain the lead frame and die carrier in a predetermined position such that a surface of the heat transfer section is exposed on a surface of the body, the lead pad is positioned in the lead pad opening, and the die carrier is electrically isolated from the lead frame. A plurality of dies are attached to the die mounting area. Each die includes an LED having first and second contacts for powering that LED. The first contacts are connected electrically to the die carrier, and the second contacts are connected electrically to the lead pad. In one aspect of the invention, the heat transfer section is positioned in an opening in the lead frame. In another aspect of the invention, the die mounting section includes a reflector and an aperture. The dies have a top surface through which light is emitted, a bottom surface that is bonded to the die mounting area, and a plurality of side surfaces. The aperture is positioned such that light from the top surface exits through the aperture and the reflector is positioned such that light from a side surface of one of the dies is reflected into the aperture.

BRIEF DESCRIPTION OF THE DRAWINGS

FIGS. 1-7 illustrate one embodiment of a light source according to the present invention.

FIG. 9 is cross-sectional view of another embodiment of a light source according to the present invention.

FIG. 10 is a cross-sectional view of another embodiment of a light source according to the present invention.

FIG. 11 is a cross-sectional view of another embodiment of a light source according to the present invention.

DETAILED DESCRIPTION OF THE PREFERRED EMBODIMENTS OF THE INVENTION

The present invention utilizes a packaging scheme having a lead frame portion and a die carrier on which the individual dies are mounted. The die carrier has sufficient thermal mass and heat transfer capacity to move heat from a large number of dies to an outer surface of the package that can be thermally connected to a printed circuit board for heat removal. The configuration of the dies is determined by the die carrier, and hence, a light source having a different configuration can be provided by changing only the die carrier, and hence, the cost of providing a light source with a different configuration of dies is substantially reduced.

Figure 6:
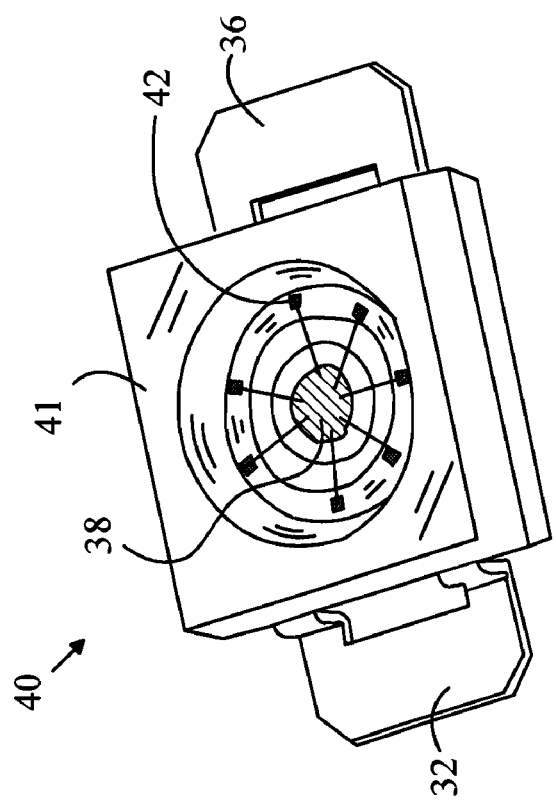

The present invention can be more easily understood with reference to FIGS. 1-7, which illustrate the various components used to construct a light source according to one embodiment of the present invention. FIG. 6 is a perspective view of light source 40 after the various components have been assembled. Light source 40 is constructed from a lead frame 30 and a die carrier 20 that are molded into a plastic body 41 after die carrier 20 and lead frame 30 have been assembled.

Refer now to FIGS. 2, 4, and 5, which illustrate die carrier 20. FIG. 2 is a perspective view of die carrier 20; FIG. 4 is a cross-sectional view of die carrier 20 through line 4-4 shown in FIG. 2 after die carrier 20 has been positioned in lead frame 30, and FIG. 5 is cross-sectional view of die carrier 20 through line 5-5 shown in FIG. 2 after die carrier 20 has been positioned in lead frame 30. Die carrier 20 is constructed from a good heat conductor such as copper or aluminum and includes a die mounting section 21 and a heat conducting section 22. Die mounting section 21 includes a die mounting surface 23 and a reflector 24.

Referring to FIGS. 4 and 5, the individual dies are mounted to die mounting surface 23 using an electrically conducting adhesive. An exemplary die 42 is shown in FIG. 5 to clarify the mounting arrangement and electrical connections. However, the dies are not attached until after the components have been assembled and the body section has been molded in place. One of the power contacts on die 42 is on the bottom surface of die 42, and hence, all of the dies are connected in parallel to die carrier 20. The other power terminal of die 42 is on the top surface of die 42 and is connected to lead pad 38 by a wire bond 43. Lead pad 38 is part of lead frame component 30 and will be discussed in more detail below. Hence, all of the top contacts of the dies are connected in parallel to lead pad 38, which is accessed via lead frame 30. All of the bottom die contacts are connected in parallel to die carrier 20 and can be accessed electrically via heat conducting section 22.

Die carrier 20 fits into lead frame 30 as shown in FIG. 3, which is a perspective view of the two components after die carrier 20 is placed into lead frame 30. Lead frame 30 has a first section 31 and a second section 35 that are separated by a gap 33 that is sized to accommodate heat conducting section 22. Section 35 includes lead pad 38, which is connected to the body of section 35 by region 37. Slot 26 in heat conducting section 22 is sized to fit around region 37 such that region 37 and heat conducting section 22 do not touch each other, and hence, remain electrically isolated from one another.

Section 35 may be viewed as having sub-sections that are arranged at different levels. The first sub-section is planar with the surface on which the packaged part will be eventually mounted. This sub-section is shown at 32 and 36. The second sub-section is approximately parallel to sub-section 36 and contains regions 37. This section is in a plane above that of sub-section 36. The third sub-section is 34. Lead pad 38 forms the fourth sub-section and is in a plane that is approximately parallel to the other three sub-sections but raised with respect to those three sub-sections such that the portion of lead pad 38 to which the wire bonds are attached is at, or above, the level of die mounting surface 23. Lead frame 30 also includes a number of openings such as hole 39 to provide improved bonding of the molding compound used to construct the lead frame body.

Refer now to FIG. 6, which is a perspective view of light source 40 after body 41 has been formed and dies 42 have been mounted and attached. When die carrier 20 is positioned in lead frame 30, the two sections do not contact one another. In addition, lead pad 38 is raised with respect to the remainder of lead frame 30. After the two components are positioned, a plastic body is formed by molding the positioned parts using an appropriate resin. For example, the body can be formed from PPA, LCP, or silicone-based materials. The molding process fills the region between lead frame 20 and die carrier 30 while leaving lead pad 38, die mounting surface 23 and reflector 24 uncoated.

Figure 7:
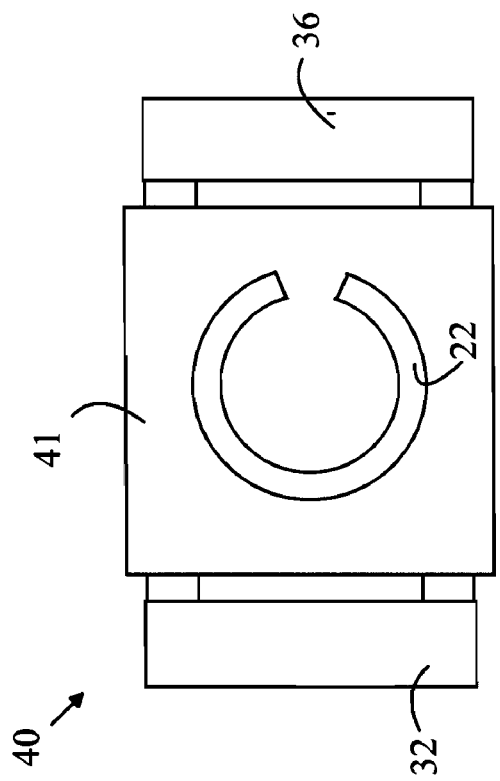

Refer now to FIG. 7, which is a bottom view of light source 40 after the molding process has been completed. The end surface of heat conducting section 22 is exposed together with the bottom surfaces of sub-regions 32 and 36. These surfaces are substantially coplanar and can be used to make electrical connections to the dies in the completed part.

The dies are mounted on the die mounting surface after the plastic body has been molded. After the dies have been mounted and connected to lead pad 38, the reflector can be filled with a transparent medium to protect the dies and provide other functions. For example, the transparent medium can include phosphors or other wavelength conversion materials to convert all or part of the light from the dies to light having a different spectrum. In the case of a white light source, the dies can emit light in the blue region of the spectrum, and the transparent medium can include particles of a phosphor that convert a portion of the blue light to yellow light. The clear medium can also include a diffusant to scatter the light generated by the dies to provide a light source that appears to be a uniformly emitting light source having a size determined by the size of the reflector cup.

It should be noted that the number of dies that are located in the light source can be varied from one to as many as the die mounting surface can hold. The heat transfer ability of the heat conducting section is significantly greater than that provided by conventional lead frame designs, since the thickness of the heat conducting section is not constrained by the thickness of the material used for lead frames. Accordingly, the same package can be utilized to construct a light source of widely varying power outputs.

Figure 8:
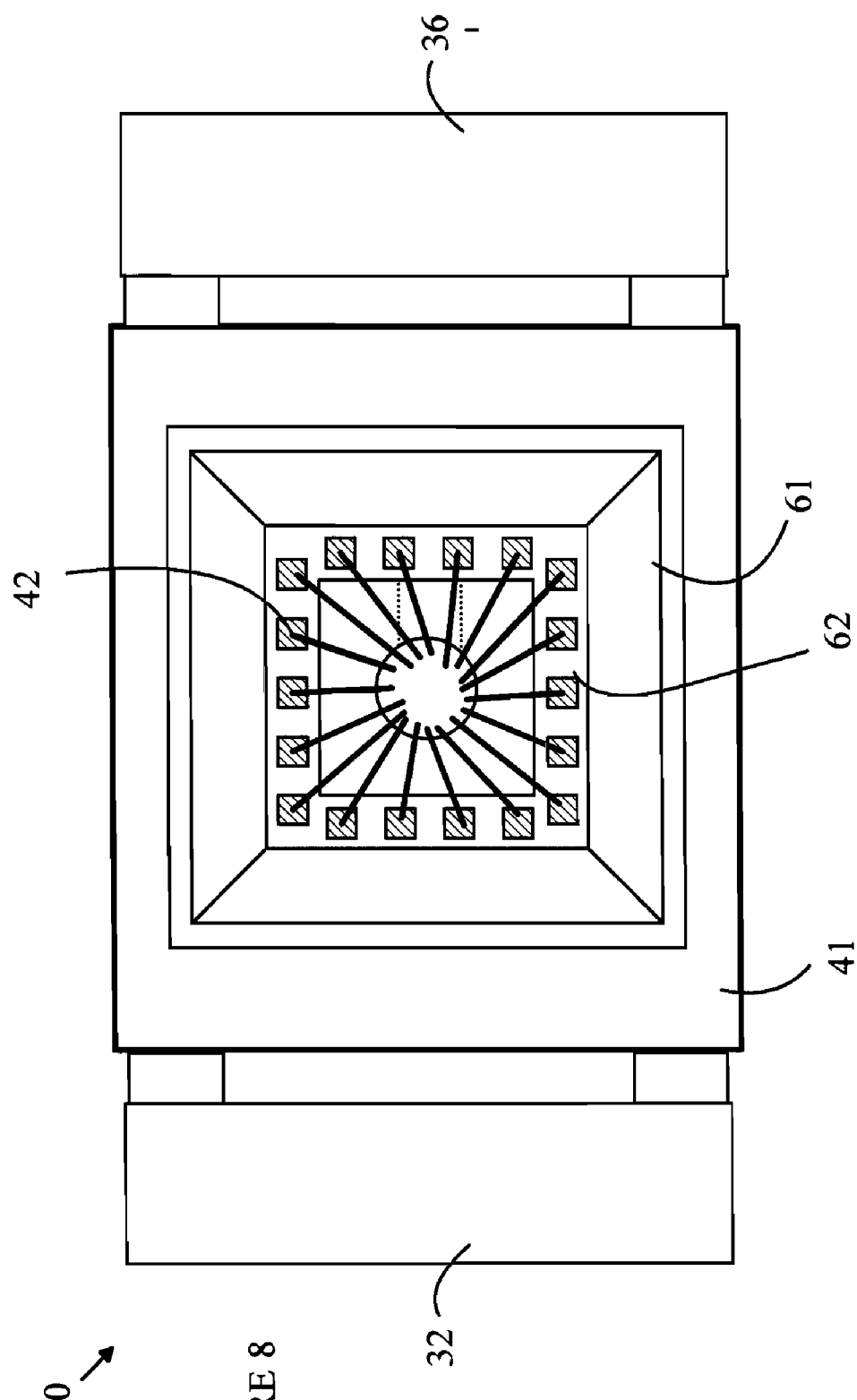
FIG. 8 is a top view of a light source according to another embodiment of the present invention.

It should also be noted that the shape of the light source can be varied by varying the shape of the die mounting area. Hence, a light source with a different configuration of dies can be constructed by changing only the die carrier. Refer now to FIG. 8, which is a top view of a light source according to another embodiment of the present invention. Light source 60 is constructed using the same lead frame as light source 40 discussed above. However, light source 60 uses a die carrier 61 in which the die mounting area 62 is rectangular, as opposed to the circular arrangement discussed above.

The above-described embodiments of the present invention have utilized a die configuration in which a single ring of dies is utilized. However, embodiments in which multiple rings of dies are utilized can also be constructed. Refer now to FIG. 9, which is a cross-sectional view of another embodiment of a light source according to the present invention. Light source 80 utilizes a die carrier 81 having two rings of dies. Die carrier 81 has two die mounting areas located at different heights from the top of light source 80. The first die mounting area is shown at 84, and the second die mounting area is shown at 83. Exemplary dies connected to die mounting area 83 are shown at 85, and exemplary dies connected to die mounting area 84 are shown at 86. The dies connected to each die mounting area have their top contacts connected to lead pad 38 by wire bonds. An exemplary wire bond is shown at 87. The bottom surface 82 of the heat conducting body is coplanar with bottom surfaces of the lead frame sections shown at 32 and 36 so that light source 80 can be surface mounted to a printed circuit board or the like.

Light source 80 utilizes the same lead frame as light source 40 discussed above. Only the die carrier needs to be changed to construct light source 80. The shape of body 92 may need to be changed if the die carrier differs significantly in size from that discussed above with respect to light source 40. However, the lead frame does not need to be altered unless the size and shape of the heat conducting section of the die carrier is changed significantly.

As noted above, the die carrier cup can be filled with a transparent medium 93 after the dies have been mounted and connected to die pad 38.

In the above-described embodiments, the die carrier does not touch lead frame 30. In those embodiments, the die carrier must be positioned with respect to the lead frame by a separate apparatus until the sections are bonded together when the plastic body is formed. However embodiments in which the lead carrier is positioned and held in place by one of the lead frame sections can also be constructed. In such embodiments, the die carrier is supported and positioned by contact with one of the lead frame sections. Refer now to FIG. 10, which is a cross-sectional view of another embodiment of a light source according to the present invention. Light source 100 is similar to light source 80 discussed above. However, in light source 100 section 34 of lead frame section 31 is raised relative to section 37 of lead frame section 35 such that chip carrier 20 rests on section 34 and is positioned with respect to the lead frame by the contact area. A key mechanism such as shown at 101 may be included in chip carrier 20 and lead frame section 34 to provide the correct alignment. It should be noted that chip carrier 20 still does not contact lead frame section 35, and hence, the light source can be powered by applying a potential between lead frame sections 31 and 35.

The contact and alignment can also be provided by modifying the chip carrier to include an area that engages one of the sections of the lead frame without engaging the other section of the lead frame. Refer now to FIG. 11, which is a cross-sectional view of another embodiment of a light source according to the present invention. Light source 130 utilizes a chip carrier 120 that includes a section 121 that extends downward from the bottom surface of chip carrier 120 in the region over lead frame section 31 so as to make contact between section 34 of lead frame section 31. In this embodiment, lead frames sections 37 and 34 can be the same height. Section 121 and the underlying lead frame section could also include a key mechanism for setting the position of the chip carrier relative to the lead frame section.

Various modifications to the present invention will become apparent to those skilled in the art from the foregoing description and accompanying drawings. Accordingly, the present invention is to be limited solely by the scope of the following claims.

What is claimed is:

1. A light source comprising:
    a die carrier comprising a die mounting section connected to a heat transfer section, said die mounting section comprising a die mounting area having a lead pad opening contained within said die mounting area;
    a lead frame comprising a lead pad;
    a body comprising an electrically insulating material that fills voids between said die carrier and said lead frame to maintain said lead frame and die carrier in a predetermined position such that a surface of said heat transfer section is exposed on a surface of said body, said lead pad is positioned in said lead pad opening, and said die carrier is electrically isolated from said lead frame;
    a plurality of dies attached to said die mounting area, each die comprising an LED having first and second contacts for powering that LED, said first contacts being connected electrically to said die carrier and said second contacts being connected electrically to said lead pad; and
    wherein said heat transfer section is positioned in an opening in said lead frame.

2. The light source of claim 1 wherein said lead frame further comprises first and second lead frame sections and wherein said die carrier is in contact with one of said lead frame sections but not the other of said first and second lead frame sections.

3. The light source of claim 1 wherein said die mounting section comprises a reflector and an aperture, said dies being characterized by a top surface through which light is emitted, a bottom surface that is bonded to said die mounting area, and a plurality of side surfaces, said aperture being positioned such that light from said top surface exits through said aperture and said reflector being positioned such that light from a side surface of one of said dies is reflected into said aperture.

4. The light source of claim 1 wherein said lead frame further comprises an extension that is coplanar with said surface of said heat transfer section, said extension being electrically connected to said lead pad.

5. The light source of claim 1 wherein said die mounting area comprises a first planar surface that surrounds said lead pad.

6. The light source of claim 5 wherein said first planar surface comprises a circular ring.

7. The light source of claim 5 wherein said first planar surface comprises a rectangular ring.

8. The light source of claim 5 wherein said die mounting area comprises a second planar surface that surrounds said lead pad, said first and second planar surfaces being different distances from said surface of said heat transfer section.

9. The light source of claim 1 wherein said die mounting section comprises a depression in which said dies are mounted and wherein said depression is filled with a medium that is transparent to light generated by said LEDs.

* * * * *